United States Patent [19]

Fuji et al.

[11] 4,422,059
[45] Dec. 20, 1983

[54] BAND-PASS FILTER HAVING MULTILAYERED COIL STRUCTURES

[75] Inventors: Tsuneharu Fuji, Neyagawa; Masakatsu Tsumura, Shijonawate; Takayoshi Ishikawa, Hirakata, all of Japan

[73] Assignee: Matsushita Electric Industrial Co., Ltd., Osaka, Japan

[21] Appl. No.: 363,998

[22] Filed: Mar. 31, 1982

[30] Foreign Application Priority Data

Apr. 8, 1981 [JP] Japan ................................. 56-53415
Dec. 8, 1981 [JP] Japan ............................... 56-198089

[51] Int. Cl.³ .......................... H01P 1/201; H01P 7/00; H01P 1/205
[52] U.S. Cl. ..................................... 333/202; 333/212; 333/219
[58] Field of Search ......................... 333/202, 208–209, 333/212, 219, 222, 223, 227–229, 230–235, 175–177

[56] References Cited

U.S. PATENT DOCUMENTS 3,970,972 7/1976 Bunner ............................ 333/222 X
4,210,884 7/1980 Tabuchi et al. ................. 333/219 X Primary Examiner—Marvin L. Nussbaum
Attorney, Agent, or Firm—Pollock, VandeSande & Priddy

[57] ABSTRACT

A bamd-pass filter comprising a shielded housing having a first and a second chamber. First and second quarter-wave resonators are disposed in the first and second chambers, respectively, for coupling with input energy and delivering output energy. First and second parallel-circuit resonators are disposed in the first and second chambers, respectively, to provide interstage coupling between resonators in the respective chambers. Each of the resonators comprises a multilayered coil structure on a finned bobbin juxtaposed on a common insulative substrate so that its coil portions are separately wound on adjacent fins of the bobbin. Each of the quarter-wave resonators has one end being short-circuited by coupling with the housing and the other end being open-circuited. Each of the parallel-circuit resonators includes a capacitor to form a parallel resonance circuit and has one end coupled to one end of the other parallel-circuit resonator at a point outside of the housing. First and second auxiliary coils are inductively coupled respectively with the parallel-circuit resonators, one end of each auxiliary coil being connected to the housing and the other ends of the auxiliary coils being coupled together to an external circuit.

8 Claims, 9 Drawing Figures

BAND-PASS FILTER HAVING MULTILAYERED COIL STRUCTURES

BACKGROUND OF THE INVENTION

The present invention relates to a band-pass filter which comprises at least two quarter-wavelength resonators each having one end thereof open-circuited and the other end thereof short-circuited, and at least two parallel circuit resonators each having a coil and a capacitor.

Conventional band-pass filters comprise within a shielded housing a plurality of juxtaposed quarter-wavelength resonators each comprised of a cylindrical bobbin on which a coil is wound. However, various problems and shortcomings are inherent in the prior art filter. One such shortcoming is that the passband characteristic of the prior art band-pass filter has a gradual decay on each of the cut-off frequency ends. Another shortcoming is that the prior art does not allow compact design.

SUMMARY OF THE INVENTION

The present invention is to eliminate or minimize the prior art problems by comprising a band-pass filter with a multilayered structure of coils wound on cylindrical finned bobbins.

According to the invention, the band-pass filter comprises within a shielded housing, a pair of quarter-wavelength resonators each comprising a bobbin formed with a plurality of axially spaced apart fins and a first multilayered coil structure having a plurality of coils each disposed between adjacent ones of the fins, the coil structure being open-circuited and the other end being short-circuited with the housing. The filter further includes a pair of parallel-circuit resonators each comprising a capacitor and a bobbin having a plurality of fins and a second multilayered coil structure having a plurality of coils each disposed between adjacent ones of the fins of the bobbins, one end of each of the parallel-circuit resonators being coupled to one end of the other parallel-circuit resonator at a point outside of the shielded housing. The parallel-circuit resonators are electromagnetically separated by a shielding plate coupled to the housing. A pair of auxiliary coils is inductively coupled with the parallel-circuit resonators respectively, one end of each of the auxiliary coils being connected to the shielded housing, the other ends of the auxiliary coils being coupled together. An input and an output coupling coil are respectively coupled inductively with the quarter-wavelength resonators. The band-pass filter of the invention is particularly advantageous for application to video IF (intermediate frequency) filters.

BRIEF DESCRIPTION OF THE DRAWINGS

The features and advantages of the present invention will become apparent from the following detailed description with reference to the accompanying drawings, in which.

DETAILED DESCRIPTION

Figure 1:
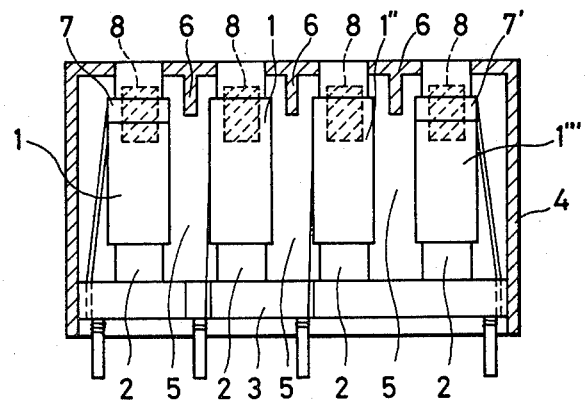
FIGS. 1 and 2 are illustration of a prior art band-pass filter.
Figure 2:
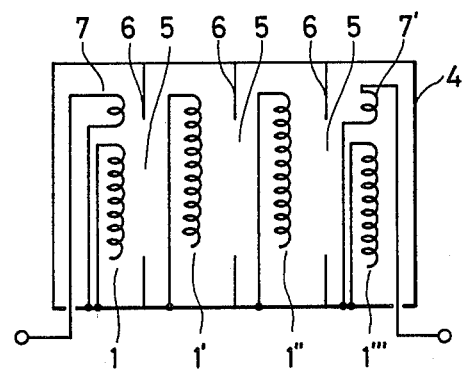

Before describing the present invention, a prior art band-pass filter will first be described with reference to FIGS. 1 and 2. FIG. 1 is an illustration of a cross-sectional view of a prior art band-pass filter the schematic details of which are shown in FIG. 2. In FIG. 1, illustrated each at 1, 1', 1", and 1''' are quarter-wavelength resonators comprising an insulative cylindrical bobbin 2 which is formed of a plastic material and has a polyethylene insulated conductor helically coiled therearound. The resonators are mounted in juxtaposition on an insulating substrate 3 so that one end of the coil of each resonator is open-circuited with the other end of the coil being coupled to ground by an earth terminal provided on the substrate 3. Illustrated at 4 is a shielded metal housing formed typically of aluminum, the metal housing comprising a plurality of shielding plates or separating walls 6 each having an opening 5 through the resonators 1, 1', 1" and 1''' are coupled adjustably. A pair of input and output coupling coils 7 and 7' are provided adjacent to the resonators 1 and 1''', respectively. Illustrated at 8 is a magnetic core provided for the purpose of adjusting the resonant frequency of each quarter-wavelength resonator.

Figure 7:
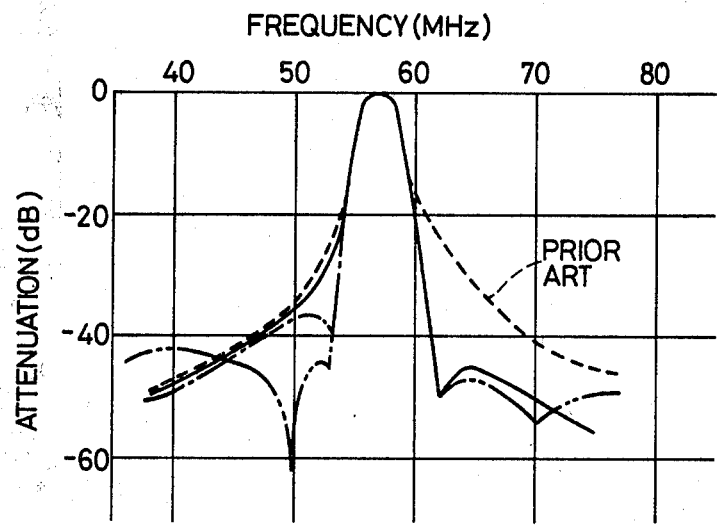
FIG. 7 is a graphic illustration of the passband characteristics of the present invention in comparison with the passband characteristic of the prior art of FIG. 1.

The frequency response characteristic of the prior art filter is indicated by a broken line curve in FIG. 7. As illustrated the response characteristic has a gradually varying decay on each end of the passband. With the prior art arrangement thus described, the length of conductors is exclusively determined by the resonant frequency of the filter, that is, the quarter-wavelength, as a result of which while the filter could successfully have a reduced height the diameter of its coils would inevitably increase, and vice versa. Therefore, it has been recognized that the prior art band-pass filter allows no compact design. A still further shortcoming inherent in the prior art band-pass filter is that while the magnetic core 8 posesses a certain amount of negative temperature coefficient, the amount of this negative coefficient is not sufficient to cover the full range of temperatures for temperature compensation purposes.

The present invention is intended to overcome the above-discussed disadvantages and shortcomings of the prior art band-pass filter, while at the same time improving the sharpness of frequency cut-off characteristics and the temperature compensating performance, and in addition the allowability of compact design. The following is a description of an embodiment of the present invention which will proceed with reference to FIGS. 3 to 11.

Figure 3:
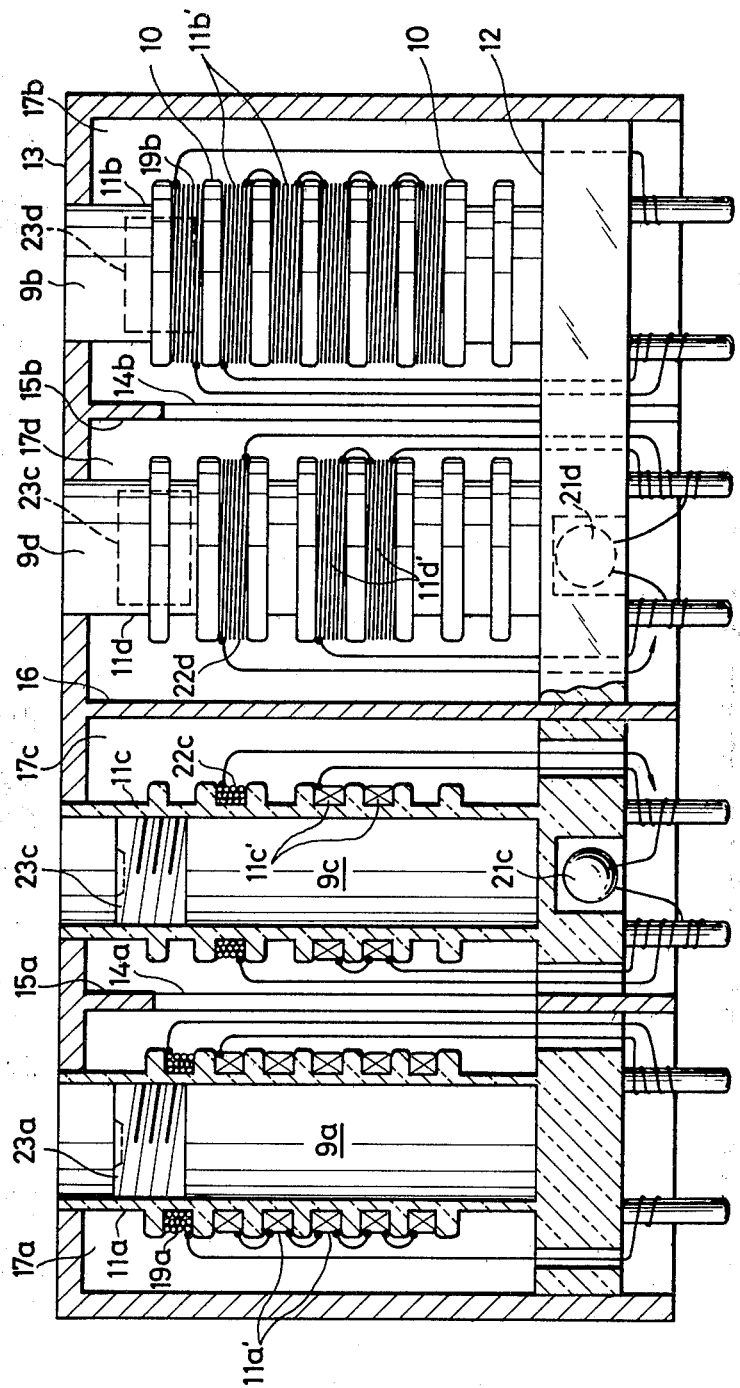
FIG. 3 is a cross-sectional view of an embodiment of the band-pass filter according to the present invention.
Figure 4:
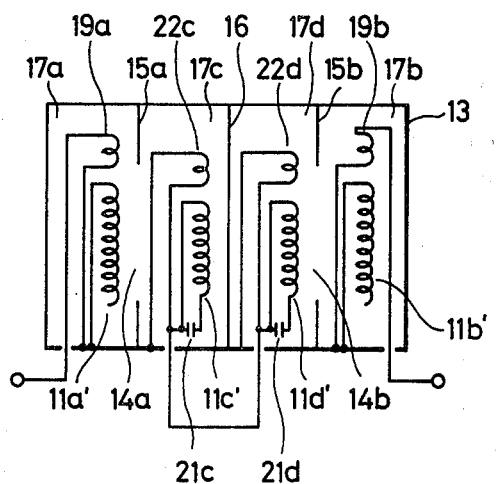
FIG. 4 is an equivalent circuit of the band-pass filter of FIG. 1.

FIG. 3 is a cross-sectional view of the band-pass filter of the invention and FIG. 4 an equivalent circuit of the filter. Illustrated at 9a and 9b are quarter-wavelength resonators comprised of plastic moulded bobbins 11a and 11b each having a plurality of axially spaced apart annular fins 10. Between adjacent fins 10 the bobbins 11a and 11b are wound by coil portions 11a' and 11b' of multilayered coil structures. Each of the coil portions has a few turns or several tens of turns of a polyurethane coated conductor. The quarter-wavelength resonators 9a and 9b are juxtaposed on a common insulative substrate 12 so that one end of each multilayered coil structures is open-circuited and the other end is short-circuited by coupling to a ground terminal mounted on the insulative substrate 12.

Illustrated at 13 is a shielded aluminum housing which is coupled to ground and comprises first and second chambers separated by a shielding plate 16, the first and second chambers being further divided with shielding plate 15a and 15b having respective coupling windows 14a, 14b into outer chamber sections 17a, 17b in which the quarter-wavelength resonators 9a and 9b are respectively disposed and inner chamber sections 17c and 17d. In the outer chamber sections 17a, 17b the quarter-wave resonators 9a, 9b are arranged to inductively couple with input and output coupling coils 19a and 19b which are mounted on the bobbins of the quarter-wave resonators 9a and 9b, respectively.

Parallel-circuit resonators 9c and 9d are each formed by plastic moulded bobbins 11c and 11d having a plurality of vertically spaced apart annular fins 10. A multilayered coil structure 11c' having a pair of coil portions and a multilayered coil structure 11d' having a pair of coil portions are mounted between adjacent fins 10 of bobbins 11c and 11d respectively, the ends of these coils being coupled respectively to terminals mounted below the insulative substrate 12 for connection to an external circuit. Coils 11c' and 11d' are each formed of a few turns of polyerethane coated conductor. In recesses provided underside of the insulative substrate 12 directly below the bobbins 11c and 11d are mounted capacitors 21c and 21d which are respectively coupled to the coils 11c' and 11d' to constitute parallel resonance circuits.

Auxiliary coils 22c and 22d of a few turns are wound on the bobbins 11c and 11d to inductively couple with the coils 11c' and 11d', respectively. One end of the auxiliary coil 22c is coupled to the ground terminal on substrate 12 and the other end of which is coupled to the coil 20c, and capacitor 21c and taken to the outside for coupling with the other auxiliary coil 22d. Similarly, one end of the auxiliary coil 22d is coupled to the ground terminal with the other end being coupled to the coil 11d' and capacitor 21d and taken to the outside where it is coupled to the auxiliary coil 22c. Illustrated at 23a, 23b, 23c, 23d are magnetic cores which are threadably engaged with the internally threaded walls of the bobbins 11a, 11b, 11c, 11d, respectively, for making adjustment on the respective resonant frequencies of the resonators 9a, 9b, 9c and 9d by means of a screwdriver.

Although the inner chamber sections 17c and 17d of the band-pass filter of the invention are separated from each other by the separating wall 16, coupling between the auxiliary coils 22c and 22d and capacitive coupling between the shielded housing 13 and the parallel-circuit resonators 9c and 9d give rise to an attenuation of a substantial value on a point slightly higher than the upper frequency end of the passband, as indicated by a solid-line curve in FIG. 7 which is favorably compared with the broken-line curve of the prior art helical band-pass filter.

Furthermore, the coils 20c and 20d have a small amount of positive values of temperature coefficient which can be compensated for by having a small amount of negative coefficient in the capacitors 21c and 21d.

Due to the multilayered coil structures, the amount of distributed capacitances can be increased significantly, whereby the inductance of the quarter-wave resonators 9a and 9b and hence the number of turns of their coils can be reduced.

The provision of capacitors 21c and 21d which form part of the parallel circuit resonators 9c, 9d permits the coils 20c and 20d to have a reduced number of turn in comparison with the prior art arrangement and as a result the bobbins 9c and 9d can be reduced in diameter, whereby the total dimensions of the band-pass filter are minimized. The present invention permits the use of a conductor of a relatively large gauge which produces sharpness in the selectivity.

Moreover, the size of coupling windows 14a and 14b can be appropriately dimensioned to obtain a desired amount of interstage coupling between adjacent resonators so that the passband of the filter can be controlled to obtain a desired bandwidth. This feature is of significant advantage for practical purposes.

Figure 5:
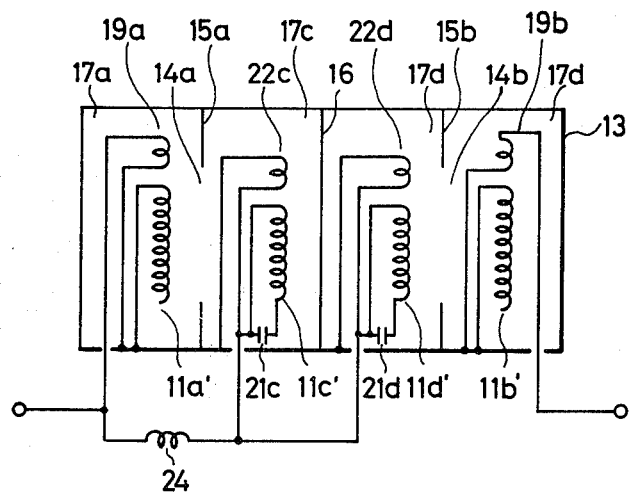
FIG. 5 is a schematic illustration of a modified embodiment of the invention.
Figure 6:
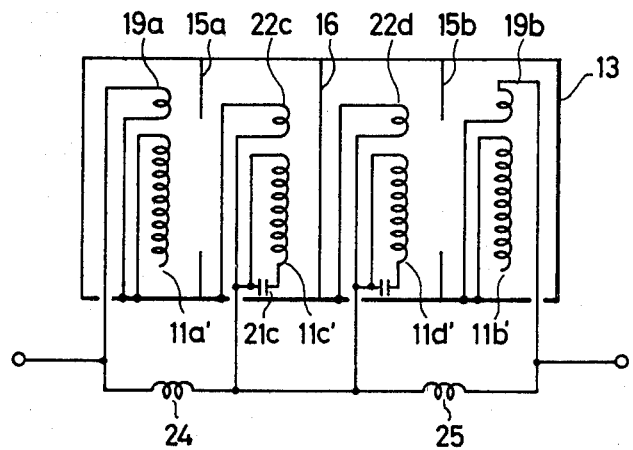
FIG. 6 is a schematic illustration of a further modification of the invention.

FIGS. 5 and 6 are illustrations of another embodiment of the present invention. The embodiment of FIG. 5 differs from the previous embodiment in that it includes a coil 24 interposed between the coil 19 and a circuit junction between auxiliary coils 22c and 22d and mounted outside of the shielded housing 13.

More specifically, the inductance of the coil 24 and capacitive coupling between the quarter-wave resonator 9a and the coil 11c' of parallel-circuit resonator 9c form a parallel resonant trap circuit which serves to give rise to a high value of attenuation at a point slightly below the lowermost frequency of the passband thereby significantly improving the sharpness of the passband characteristic at the lower cut-off frequency as depicted by a dot-and-dash line curve in FIG. 7.

In addition, by making adjustment on the vertical position of the magnetic cores 23a and 23b it is possible to control the amount of their coupling with the coils 11a' and 11c' and therefore a desired bandwidth can be obtained. Adjustment on cores 23c and 23d also results in a variation in the capacitive coupling between coils 11a' and 11c' which in turn results in a variation in the trapping frequency of the trap circuit referred to above. However, the frequency of the trap circuit can be made to remain constant by the provision of a magnetic core in the coil 24 such that it counteracts such frequency variations.

Therefore, the invention provides an advantage in that it allows a wide range of variations in the bandwidth of the filter without having to alter the gauge of the conductors and the dimensions of the coupling windows 14 of the shielded housing 13. Specifically, the bandwidth coils of the resonators 9a and 9b or the ratio of the number of such coils to the number of turns of wire wound on each of such coils. Otherwise, the opening of the coupling windows 14 would have to be increased.

A further embodiment of the present invention shown in FIG. 6 differs from the FIG. 5 embodiment in that it further includes a coil 25 connected between the output coil 19b and a circuit junction between the auxiliary coils 22a and 22b. The insertion of coils 24 and 25 introduces attenuations on points slightly lower and higher than the passband as indicated by a two-dot-dash line curve in FIG. 7.

In the embodiment of FIG. 6, variations in the inductance values of coils 24 and 25 will make it possible to obtain a desired cut-off frequency characteristic on the lower frequency end of the passband while at the same time providing an advantage in that it can suppress the foldover frequency component generated by the trap circuit.

The separating wall 15c could be formed with a coupling window which would serve to add an extra amount of capacitive coupling between coils 11c' and 11d' with the result that a gradual decay will occur at the high frequency cut-off end of the passband. This affords an optional feature of the invention with which the cut-off characteristic of the high frequency end could be altered to meet specific requirements.

Winding operation during manufacture could be facilitated by separating the insulative substrate into parts with which the finned bobbins 11a, 11b, 11c, 11d are integrally formed respectively to permit each of such integrated bobbin structures to be coiled separately with respective windings. This arrangement would eliminate the use of a compound or wax for fixing the conductors, thereby significantly improving the moisture resistant properties of the coils.

The coils 24 and 25 could also be mounted on the bobbins 9 in a manner identical to that with which the auxiliary coils 22c, 22d are mounted.

Figure 8:
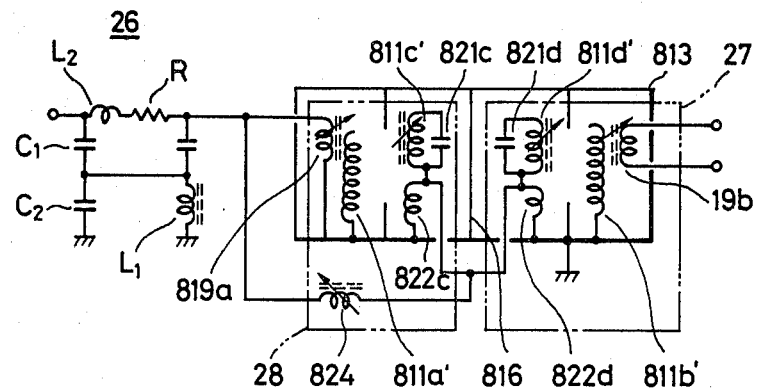
FIG. 8 is a block diagram in part of a video intermediate frequency filter embodying the present invention.

As described above, the band-pass filter constructed in a manner as taught in the present invention has significantly improved cut-off characteristics and is kept to a minimum which can be advantageously employed in television receivers to serve as a video intermediate frequency filter as illustrated in FIG. 8.

FIG. 8 is a schematic illustration of a video intermediate frequency filter of a television receiver. The VIF comprises an audio trap circuit 26 used for trapping signals on an adjacent television channel. This trap circuit is formed by capacitors $C_1$, $C_2$, $C_3$, coils $L_1$, $L_2$, and a resistor R all of which are connected to form a bridged T network. The coil $L_2$ is a peaking coil which serves to improve the sharpness of the higher cut-off frequency of the trap circuit 26. The output of the audio trap circuit 26 is coupled to an input of a band-pass filter of the present invention indicated by numerals identical to those used in FIGS. 3 to 6 preceded by the figure number. The output of the audio trap circuit 26 is applied to the input coil 819a and also to coil 824 which is coupled to the junction between auxiliary coils 822c and 822d. The inductance of coil 824 and capacitive coupling between coils 819a, 811a', and 822c, constitute a parallel resonance circuit which produces an attenuation in a lower cut-off frequency point of the passband to act as a video trap circuit 28 for trapping signals on the adjacent television channel. This parallel resonance circuit also forms a capacitively coupled trap circuit with the shielded housing 13 giving rise to an attenuation in a higher frequency point of the passband. The junction between the coils 824 and 822c serves as an output terminal of the video trap circuit 28 and is coupled to the coil 822d. Coil 822c, parallel circuit resonator 809d (capacitor 821d and coil 820d), quarter-wave resonator 809b and output coil 819b constitute a band-pass filter 27. The VIF of FIG. 8 thus provides a high attenuation on either cut-off frequency point. In particular, the difference in attenuation between the video trapping frequency of the adjacent channel and the foldover frequency is significantly reduced on the lower cut-off frequency. In other words, the video trap of the adjacent channel is broadend so that adjustment of trapping frequency can be relaxed to advantage for manufacture.

Figure 9:
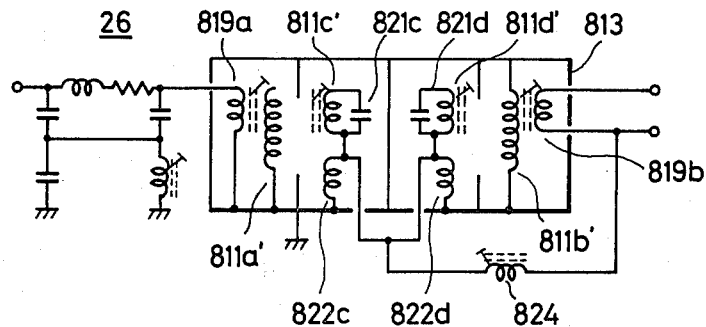
FIG. 9 is a modified embodiment of FIG. 8.

The VIF of FIG. 8 can be alternatively modified as shown in FIG. 9 which differs from the FIG. 8 embodiment in that the coil 824 is connected to the output coil 819b.

What is claimed is:

1. A band-pass filter comprising within a shielded housing having first and second chambers separated by a shielding plate:

first and second quarter-wavelength resonators mounted respectively in said first and second chambers and each comprising a bobbin formed with a plurality of axially spaced apart fins and a multilayered coil structure having a plurality of coil portions each mounted between adjacent ones of said fins, said coil structure being open-circuited at one end thereof and short-circuited at the other end;

first and second parallel-circuit resonators mounted respectively in said first and second chambers to provide interstage coupling with said first and second quarter-wavelength resonators and each comprising a capacitor and a bobbin having a plurality of fins and a multilayered coil structure having a plurality of coil portions each mounted between adjacent ones of the fins of said bobbins, one end of each of said parallel-circuit resonators being coupled to one end of the other parallel-circuit resonator at a circuit point outside of said shielded housing;

first and second auxiliary coils inductively coupled with said first and second parallel-circuit resonators respectively, one end of each of said auxiliary coils being short-circuited and the other ends of said auxiliary coils being coupled together to said circuit point; and an input and an output coupling coil respectively coupled inductively with said quarter-wavelength resonators.

2. A band-pass filter as claimed in claim 1, further comprising a second coil interposed between one of said parallel-circuit resonators and one of said input and output coils.

3. A band-pass filter as claimed in claim 1, wherein said input and output coupling coils are disposed on the bobbins of said quarter-wavelength resonators in the form of a multilayered coil structure.

4. A band-pass filter as claimed in claim 2, wherein said second coil is mounted on a bobbin having a plurality of fins in the form of a multilayered coil structure.

5. A band-pass filter as claimed in claim 1, wherein each of said auxiliary coils are mounted on the bobbins of said parallel-circuit resonators, respectively.

6. A band-pass filter as claimed in claim 1, further comprising a second shielding plate formed with a coupling window and located between the resonators in each of said first and second chambers.

7. A band-pass filter as claimed in claim 1, wherein said shielding plate is formed with a coupling window.

8. A video intermediate frequency filter comprising;

a shielded housing having first and second chambers separated by a shielding plate:

first and second quarter-wavelength resonators mounted respectively in said first and second chambers and each comprising a bobbin formed with a plurality of axially spaced apart fins and a multilayered coil structure having a plurality of coil portions each wound between adjacent ones of said fins, said coil structure being open-circuited at one end thereof and short-circuited at the other end;

first and second parallel-circuit resonators mounted respectively in said first and second chambers to provide interstage coupling with said first and second quarter-wavelength resonators and each comprising a capacitor and a bobbin having a plurality of fins and a multilayered coil structure having a plurality of coil portions each wound between adjacent ones of the fins of said bobbins, one end of each of said parallel-circuit resonators being coupled to one end of the other parallel-circuit resonator at a point outside of said shielded housing;

first and second auxiliary coils inductively coupled with said first and second parallel-circuit resonators respectively, one end of each of said auxiliary coils being short-circuited and the other ends of said auxiliary coils being coupled together;

an input and an output coupling coil respectively coupled inductively with said quarter-wavelength resonators; and a second coil interposed between one of said parallel-circuit resonators and one of said input and output coils.

* * * * *